United States Patent
Zhang et al.

(10) Patent No.: US 9,484,923 B2
(45) Date of Patent: Nov. 1, 2016

(54) SIGNAL TRANSMISSION CIRCUIT SUITABLE FOR DDR

(71) Applicant: MStar Semiconductor, Inc., Hsinchu Hsien (TW)

(72) Inventors: Yao-Zhong Zhang, Shanghai (CN); Jian-Feng Shiu, Zhubei (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 0 days.

(21) Appl. No.: 14/734,161

(22) Filed: Jun. 9, 2015

(65) Prior Publication Data

US 2015/0381179 A1 Dec. 31, 2015

(30) Foreign Application Priority Data

Jun. 27, 2014 (CN) .......................... 2014 1 0299368

(51) Int. Cl.
| | |
|---|---|
| H03K 3/00 | (2006.01) |
| H03K 19/0185 | (2006.01) |
| G11C 7/22 | (2006.01) |
| G11C 7/10 | (2006.01) |

(52) U.S. Cl.
CPC ..... *H03K 19/018521* (2013.01); *G11C 7/1057* (2013.01); *G11C 7/225* (2013.01)

(58) Field of Classification Search
None
See application file for complete search history.

(56) References Cited

U.S. PATENT DOCUMENTS

| | | | |
|---|---|---|---|
| 2009/0014801 A1* | 1/2009 | Chen | H01L 27/0266 257/357 |
| 2011/0316586 A1* | 12/2011 | Knierim | H03K 17/102 326/80 |
| 2015/0061746 A1* | 3/2015 | Liu | H03K 19/018521 327/333 |

* cited by examiner

*Primary Examiner* — Long Nguyen
(74) *Attorney, Agent, or Firm* — Edell, Shapiro & Finnan, LLC (57) ABSTRACT

A signal transmission method suitable for DDR for driving a connecting pad includes a level shifting circuit including up and down level shifters, a buffer circuit including up and down buffer units, and an output circuit. The level shifting circuit, disposed between a DDR operating voltage and a ground voltage, receives an input signal in a first operating voltage equal to the ground voltage and a second operating voltage smaller than the DDR operating voltage. The up buffer unit is disposed between the DDR operating voltage and a first reference voltage, and the down buffer unit is disposed between the ground voltage and a second reference voltage equal to the second operating voltage. The up and down level shifters adopt IO devices, and other components adopt core devices. The first reference voltage is a difference between the DDR operating voltage and the second reference voltage.

12 Claims, 6 Drawing Sheets

SIGNAL TRANSMISSION CIRCUIT SUITABLE FOR DDR

This application claims the benefit of People's Republic of China application Serial No. 201410299368.2, filed Jun. 27, 2014, the subject matter of which is incorporated herein by reference.

BACKGROUND OF THE INVENTION

1. Field of the Invention

The invention relates in general to a signal transmission circuit, and more particularly to a signal transmission circuit suitable for DDR.

2. Description of the Related Art

DDR SDRAM is an acronym of double-data-rate synchronous dynamic random access memory. DDR is first proposed by Samsung in 1996, and is a memory specification collaboratively defined by eight manufacturers including NEC, Mitsubishi, Fujitsu, Toshiba, Hitachi, TI, Samsung and Hyundai. DDR also gained supported from main chipset manufacturers including AMD, VIA and SiS. Being an upgrade version of the common SDRAM, DDR is also referred to as SDRAM II. One critical feature of the DDR technology is that, data can be transmitted at rising edges and falling edges of clocks, and so the data transmission speed can be doubled without changing the clock rate. As such, DDR is extensively applied in various signal processing systems.

In general, an integrated circuit is roughly divided into a core portion and an input and output (IO) portion. The IO portion bridges the communication to the external for the core portion. In addition to transmitting core signals generated by the core portion to outside the integrated circuit via a connecting pad, the IO portion also needs to transmit external signals sent from the external to the connecting pad further to the core portion for processing. It is required that the operating voltage of the core portion be reduced with demands of the increasing operating speed and power saving effect of electronic products. Similarly, to increase the transmission efficiency of external signals between integrated circuits, the driving voltage of new-generation external signals is also lowered. Take a double-data-rate three synchronous dynamic random access memory (DDR3 SDRAM) for example. The specified operating voltage of the DDR3 SDRAM is 1.5V, whereas the operating voltages of the DDR1 and DDR2 SDRAMs are 2.5V and 1.8V, respectively. In the latest DDR4, the operating voltage is reduced to even as low as 1.2V.

Two devices can be manufactured from a semiconductor wafer by a conventional semiconductor manufacturing process—a core device and an IO device. Generally, core devices have a faster speed and a stronger driving capability but can withstand a lower voltage difference. That is, all conducting ends (e.g., the gate, source and drain) of a core device can have a lower voltage difference, e.g., 1.1V. On the other hand, IO devices have a slower speed and a weaker driving capability but can withstand a greater voltage difference. That is, all conducting ends (the gate, source and drain) of an IO device can have a greater voltage difference, e.g., 1.5V. For example, when the IO device and the core device are both MOS devices, the gate oxidation layer in the IO device is thicker than the gate oxidation layer in the core device, such that the IO device has better robustness for withstanding higher voltage stress.

Figure 1:
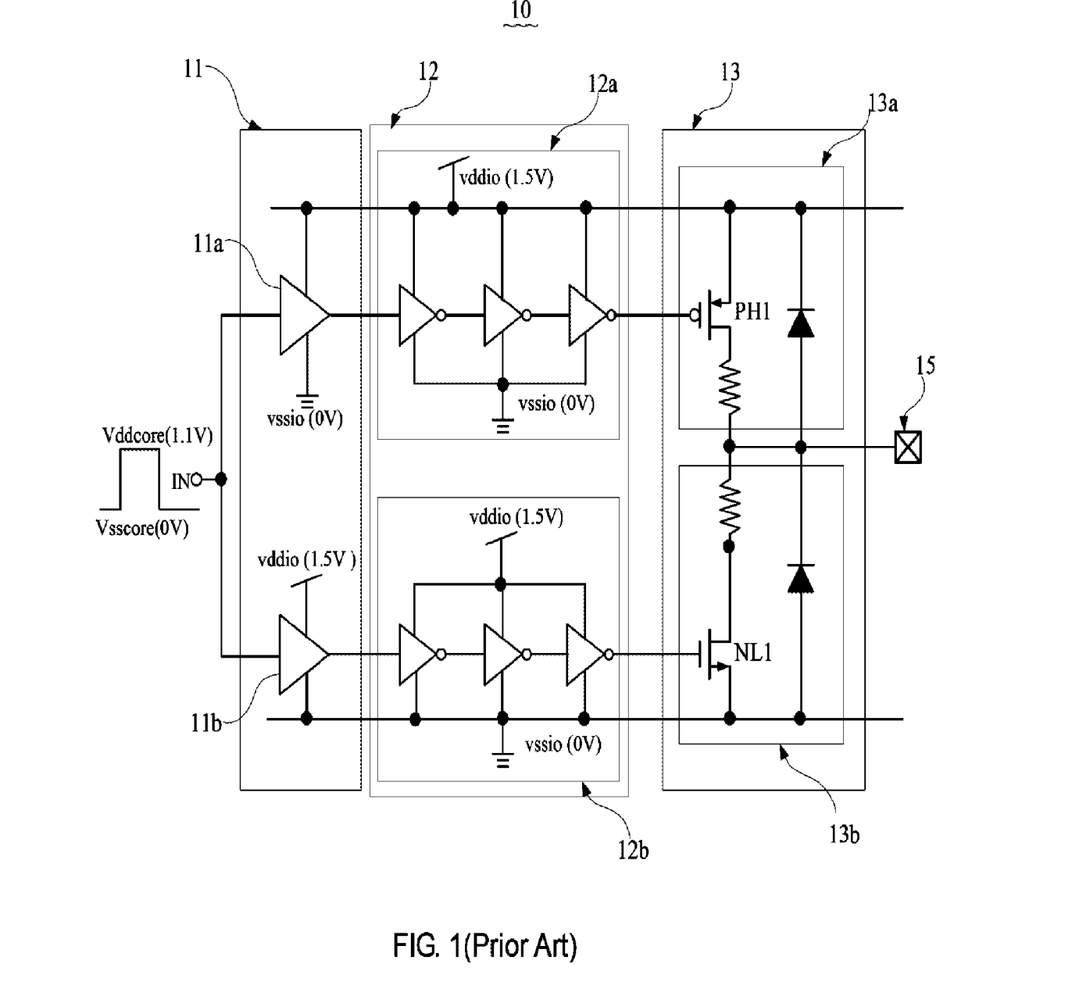
FIG. 1 is a circuit diagram of a current signal transmission circuit suitable for DDR.

FIG. 1 shows a current signal transmission circuit 10 suitable for DDR, e.g., DDR3, to transmit high-speed clock signals or data signals. As shown in FIG. 1, the current signal transmission circuit 10 drives a connecting pad 15, and includes a level shifting circuit 11, a buffer circuit 12 and an output circuit 13. The output circuit 13 includes a pull-up circuit 13a and a pull-down circuit 13b. The buffer circuit 12 includes an up buffer unit 12a and a down buffer unit 12b, and the level shifting circuit 11 includes an up level shifter 11a and a down level shifter 11b. The up level shifter 11a and the down level shifter 11b of the level shifting circuit 11 receive an input signal IN. For example, the input signal IN is a square-wave signal formed by a first operating voltage Vsscore and a second operating voltage Vddcore, e.g., a square-wave signal formed by 0V and 1.1V. Components in the signal transmission circuit 10 are all implemented by IO devices. For example, inverters in the up level shifter 11a, the down level shifter 11b, the up buffer unit 12a and the down buffer unit 12b are all disposed between an operating voltage Vddio (1.5V) and a ground voltage Vssio (0V), and a pull-up transistor PMOS T1 and a pull-down transistor NMOS 13a in the pull-up circuit 13a and the pull-down circuit 13b are capable of withstanding a 1.5V voltage difference (Vddio–Vssio). Further, the voltage difference between two operating voltages of the input signal IN corresponds to the output of the core circuit, and is usually smaller, e.g., smaller than the DDR3 operating voltage Vddio (1.5V). In the signal output circuit 10, a pull-up transistor PMOS and a pull-down transistor NMOS in the pull-up circuit 13a and the pull-down circuit 13b are implemented by IO devices having weaker capabilities. That is, to satisfy DDR3 driving specifications, an extremely large semiconductor area is required.

Figure 2:
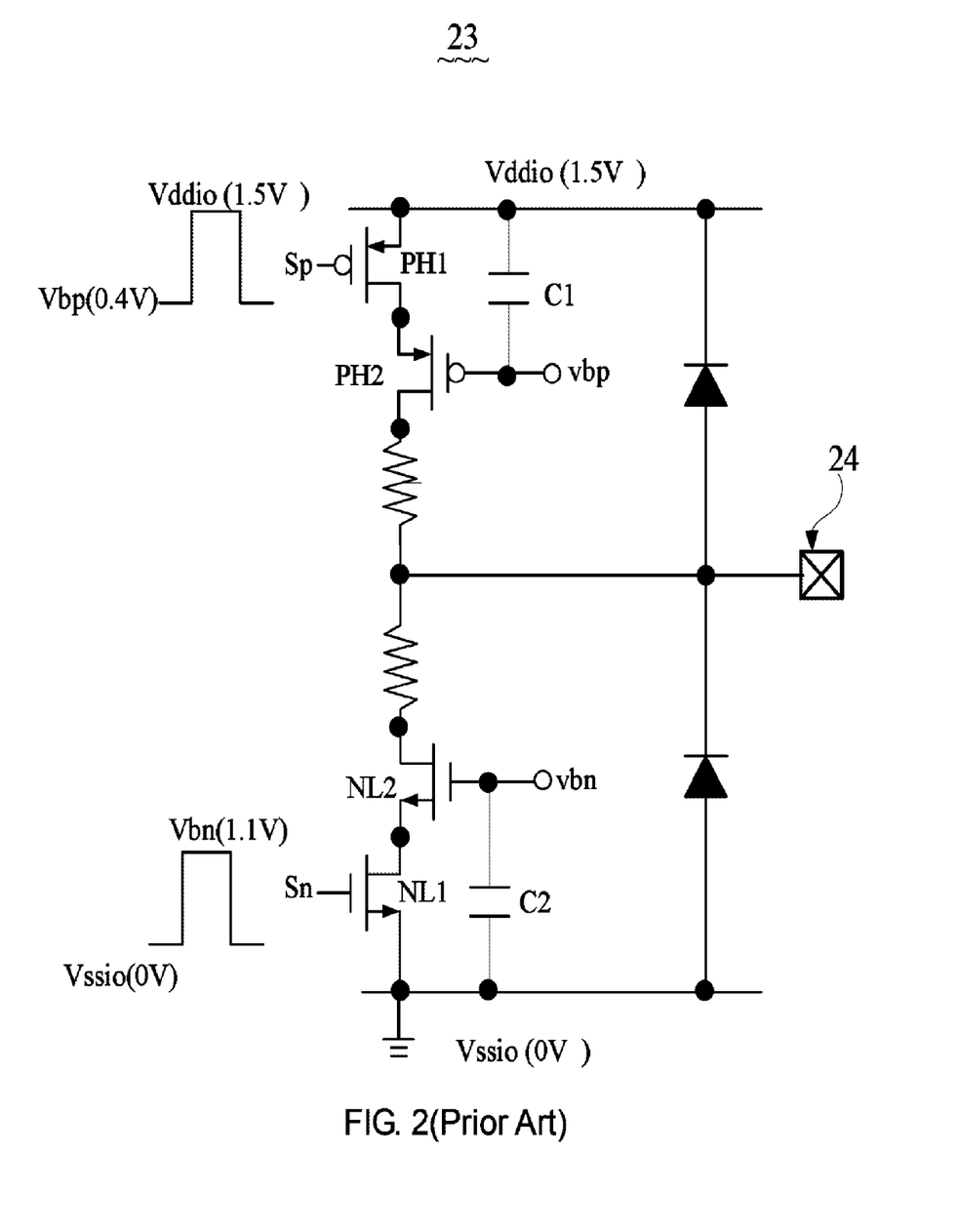
FIG. 2 is a circuit diagram of another current output circuit.

The signal transmission circuit may also reduce the required semiconductor area by adopting core devices. FIG. 2 shows another current output circuit 23 for replacing the output circuit 13 in FIG. 1. Pull-up transistors PMOS PH1 and PH2 and pull-down transistors NMOS NL1 and NL2 in the output circuit 23 are implemented by core devices. The gate of the pull-up transistor PMOS PH1 receives a logic signal Sp having high and low logic levels of 1.5V and 0.4V, respectively, and the gate of the pull-up transistor PMOS PH2 is connected to a reference voltage having a voltage of 0.4V. The gate of the pull-down transistor NMOS NL2 receives another reference voltage Vbn having a voltage of 1.1V, and the gate of the pull-down transistor NMOS NL1 receives another logic signal Sn having high and low logic levels of 1.1V and 0V, respectively. The high logic level refers to a voltage level of a signal when the signal is at logic "1", and the low logic level refers to a voltage level of a signal when the signal is at logic "0". The pull-up transistors PMOS PH1 and PH2 are connected in series, and the pull-down transistors NL1 and NL2 are connected in series. Such series connection prevents the core devices (pull-up transistors T1 and T2 and pull-down transistors T3 and T4) operating at a 1.1V operating voltage from damages caused by higher operating voltages (e.g., 1.5V).

However, in the output circuit 23, between the gates of the pull-up transistor PMOS PH2 and the pull-down transistor NMOS NL2 and the connecting pad 24 is an extremely large parasitic capacitance. To prevent unstable signals of the reference voltages Vbp and Vpn received at the gates of the pull-up transistor PMOS PH2 and the pull-down transistor NMOS NL2, very large decoupling capacitors C1 and C2 need to be connected to the gates of the pull-up transistor PMOS PH2 and the pull-down transistor NMOS NL2, respectively, to eliminate or alleviate the effects that the signal change at the connecting pad 24 has on the reference voltages Vbp and Vbn. The decoupling capacitors C1 and C2 may further occupy a substantial semiconductor area.

Therefore, there is a need for a signal transmission circuit suitable for DDR to solve the above issues.

SUMMARY OF THE INVENTION

The invention is directed to a signal transmission circuit suitable for DDR. The signal transmission circuit of the present invention has a stronger driving capability, a smaller semiconductor area and a higher stability.

The present invention provides a signal transmission circuit suitable for DDR adapted to drive a connecting pad. The signal transmission circuit includes a level shifting circuit, a buffer circuit and an output circuit. The level shifting circuit includes an up level shifter and a down level shifter. The up level shifter and the down level shifter are disposed between a DDR operating voltage and a ground voltage, and receive an input signal (IN) to respectively output a first shift signal and a second shift signal. The input signal includes a first operating voltage and a second operating voltage. The first operating voltage is equal to the ground voltage, and the second operating voltage is a driving voltage of a core device and is smaller than the operating voltage. The buffer circuit includes an up buffer unit and a down buffer unit. The up buffer unit is disposed between the DDR operating voltage and a first reference voltage, and is coupled to an output of the up level shifter to receive the first shift signal to output a first logic signal according to the first shift signal. The down buffer unit is disposed between the ground voltage and a second reference voltage, and is coupled to an output of the down level shifter to receive the second shift signal to output to a second logic signal according to the second shift signal. The output circuit includes a pull-up circuit and a pull-down circuit. The pull-up circuit is coupled to the up buffer unit to selectively output the DDR operating voltage to the connecting pad according to the first logic signal. The pull-down circuit is coupled to the down buffer unit, and selectively outputs the ground voltage to the connecting pad according to the second logic signal. The up level shifter and the down level shifter adopt input and output (IO) devices to correspondingly output the first shift signal and the second shift signal, respectively. The up buffer unit, the down buffer unit, the pull-up circuit and the pull-down circuit adopt core devices. The second reference voltage is equal to the second operating voltage, and the first reference voltage is a difference between the DDR operating voltage and the second reference voltage.

The present invention provides following features compared to the prior art. In the signal transmission circuit suitable for DDR of the present invention, only the up level shifter and the down level shifter adopt IO devices to correspondingly output the first shift signal and the second shift signal, respectively, while other components adopt core devices. Therefore, signal transmission circuit suitable for DDR of the present invention has a stronger driving capability and occupies a smaller semiconductor area. The up level shift and the down level shifter are capable of stably outputting the first shift signal and the second shift signal by utilizing the first reference voltage and the second reference voltage, and hence have a higher stability.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 3:
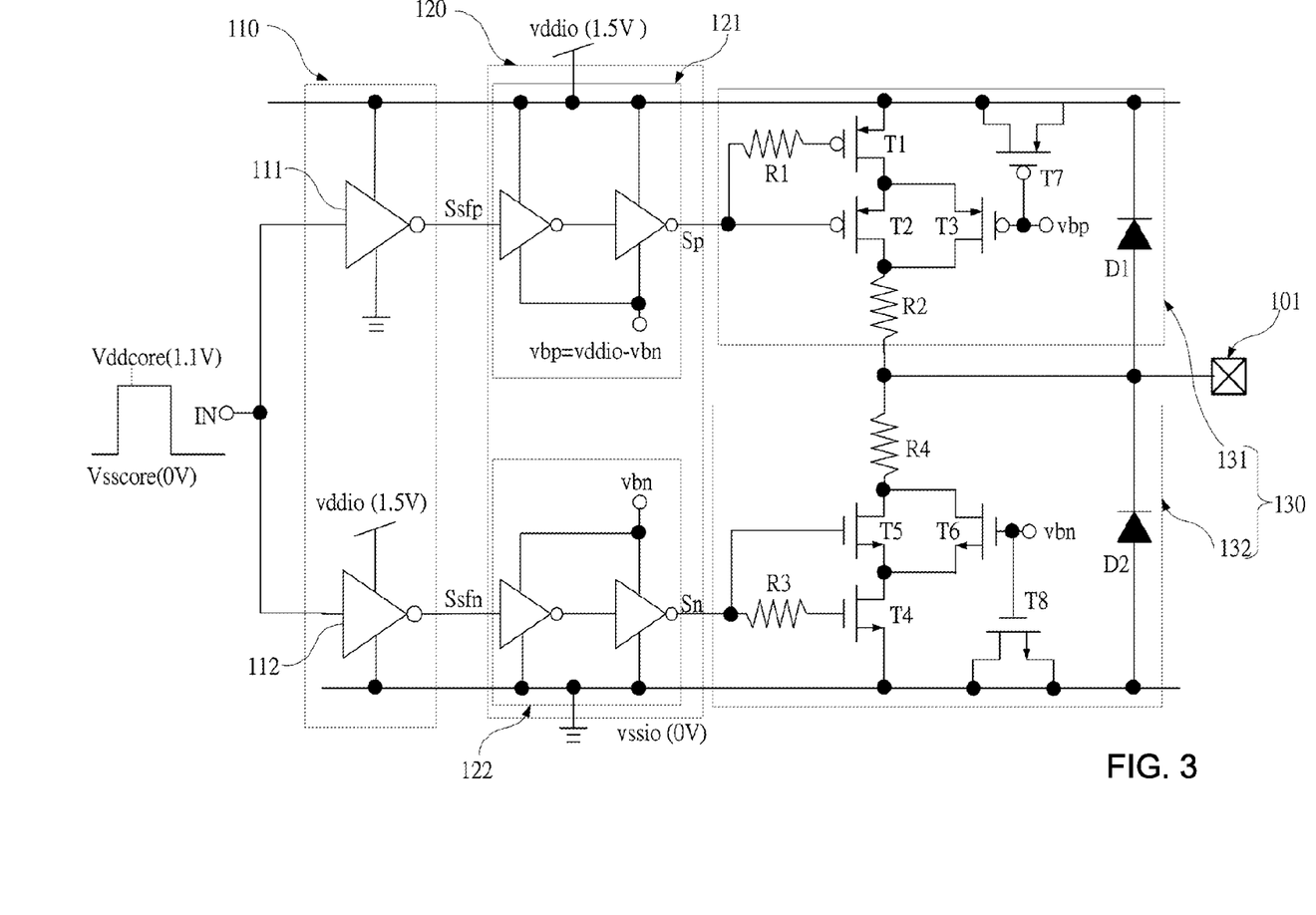
FIG. 3 is a circuit diagram of a signal transmission circuit for DDR according to an embodiment of the present invention.

FIG. 3 shows a schematic diagram of a signal transmission circuit suitable for DDR according to an embodiment of the present invention. DDR3 with a 1.5V operating voltage is given as an example for explaining the present invention. In other embodiments, the signal transmission circuit of the present invention may be applied to other types of DDR, e.g., DDR3L with a 1.35V operating voltage or DDR4 with a 1.2V operating voltage.

As shown in FIG. 3, a signal transmission circuit 100 suitable for DDR of the present invention is adapted to drive a connecting pad 101, and includes a level shifting circuit 110, a buffer circuit 120 and an output circuit 130.

The level shifting circuit 110 includes an up level shifter 111 and a down level shifter 112. The up level shifter 111 and the down level shifter 112 are disposed between a DDR3 operating voltage Vddio (1.5V) and a ground voltage Vssio (0V), and receive an input signal IN. The input signal IN is a square-wave signal formed by a first operating voltage Vsscore and a second operating voltage Vddcore. The first operating voltage Vsscore and the ground voltage Vssio are equal, and are 0V. The second operating voltage Vddcore corresponds to a driving voltage of core devices, and may be set to 1.1V, which is smaller than the DDR3 operating voltage Vddio (1.5V).

The up level shifter 111 and the down level shifter 112 correspondingly output a first shift signal Sspf and a second shift signal Ssfn according to the input signal IN as well as the DDR3 operating voltage Vddio (1.5V) and the ground voltage Vssio (0V), respectively.

The buffer unit 120 includes an up buffer unit 121 and a down buffer unit 122. The up buffer unit 121 is disposed between the DDR operating voltage Vddio (1.5V) and a first reference voltage Vbp, and is powered by the DDR operating voltage Vddio and the first reference voltage Vbp. Further, the up buffer unit 121 is coupled to the up level shifter 111, and generates a first logic signal Sp according to the first shift signal Ssfp. The down buffer unit 122 is disposed between the ground voltage Vssio and a second reference voltage Vbn, and is powered by the ground voltage Vssio and the second reference voltage Vbn. Further, the down buffer unit 122 is coupled to the down level shifter 112, and generates a second logic signal Sn according to a second shift signal Ssfn. The second reference voltage Vbn is equal to the second operating voltage Vddcore (1.1V) in the input signal IN. The first reference voltage Vbp is equal to a difference between the DDR operating voltage Vddio and the second reference voltage Vbn; that is, Vbp=Vddio−Vddcore=1.5V−1.1V=0.4V.

The up buffer unit 121 and the down buffer unit 122 may be formed by multiple cascade inverters, respectively. In the embodiment, two cascade inverters are depicted, and are utilized to reduce capacitive loads of the up level shifter 111 and the down level shifter 112.

The output circuit 130 includes a pull-up circuit 131 and a pull-down circuit 132. The pull-up circuit 131, disposed between the DDR3 operating voltage Vddio and the connecting pad 101, is coupled to an output of the up buffer unit 121 to receive the first logic signal Sp, and selectively outputs the operating voltage Vddio to the connecting pad 101 according to the first logic signal Sp.

Similarly, the pull-down circuit 132, disposed between the ground voltage Vssio and the connecting pad 101, is coupled to an output of the down buffer unit 122 to receive the second logic signal Sn, and selectively outputs the ground voltage Vssio to the connecting pad 101 according to the second logic signal Sn.

More specifically, the pull-up circuit 131 mainly includes switch elements T1 to T3. One person skilled in the art can understand that, each switch element described below includes a control end, a first path end and a second path end. The switch elements may be implemented by transistors. Thus, the control end of a switch element is the gate of the transistor, the first path end is a source-drain of the transistor and the second path end of the switch element is another source-drain of the transistor.

The switch element T1 has its control end coupled to the output end of the up buffer unit 121 via a resistor R1 to receive the first logic signal Sp, and its first path end coupled to the DDR3 operating voltage Vddio (1.5V). The switch element T2 has its control end coupled to the output end of the up buffer unit 121 to receive the first logic signal Sp, its first path end coupled to the second path end of the switch element T1, and its second path end coupled to the connecting pad 101 via a resistor R2. The switch element T3 has its control end coupled to the first reference voltage Vbp, its first path end coupled to a connecting node between the second path end of the switch element T1 and the first path end of the switch element T2, and its second path end coupled to a connecting node between the second path end of the switch element T2 and the resistor R2.

Similarly, the pull-down circuit 132 mainly includes switch elements T4 to T6. The switch element T4 has its control end coupled to the output end of the down buffer unit 122 via a resistor R3 to receive the second logic signal Sn, and its first path end coupled to the ground voltage Vssio. The switch element T5 has its control end coupled to the output end of the down buffer unit 122 to receive the second logic signal Sn, its first path end coupled to the second path end of the switch element T4, and its second path end coupled to the connecting pad 101 via a resistor R4. The switch element T6 has its control end coupled to the second reference voltage Vbn, its first path end coupled to a connecting node between the second path end of the switch element T4 and the first path end of the switch element T5, and its second path end coupled to a connecting node between the second path end of the switch element T5 and the resistor R4.

The pull-up circuit 131 may further include a switch element T7 and a diode D1. The switch element T7 has its control end coupled to the control end of the switch element T3 and the first reference voltage Vbp, and its first path end and second path end coupled to the DDR3 operating voltage Vddio. The diode D1 is couple in reverse between the connecting pad 101 and the DDR operating voltage Vddio. More specifically, the diode D1 has its anode coupled to a connecting node between the resistor R2 and the resistor R4 and the connecting pad 101, and its cathode coupled to the DDR3 operating voltage Vddio.

Similarly, the pull-down circuit 132 may further include a switch element T8 and a diode D2. The switch element T8 has its control end coupled to the control end of the switch element T6 and the second reference voltage Vbn, and its first path end and second path end coupled to the ground voltage Vssio. The diode D2 is coupled in reverse between the ground voltage Vssio and the connecting pad 101. More specifically, the diode D2 has its anode coupled to a connecting node between the resistor R2 and the resistor R4 and the connecting pad 101.

The switch elements T1, T2, T3 and T7 in the pull-up circuit 131 are first-type switch elements, and may be PMOS transistors in this embodiment. The switch elements T4, T5, T6 and T8 in the pull-down circuit 132 are second-type switch elements, and may be NMOS transistors in the embodiment. That is, the type of the first-type switch elements is opposite the type of the second-type switch elements.

In the present invention, the up level shifter 111 and the down level shifter 112 adopt IO devices to correspondingly output the first shift signal Ssfp and the second shift signal Ssfn, respectively. Other elements, e.g., the up buffer unit 121, the down buffer unit 122, the pull-up circuit 131 and the pull-down circuit 132 all adopt core devices.

That is to say, as shown in FIG. 3, the up level shifter 111 and the down level shifter 112 may be disposed between the DDR3 operating voltage Vddio (1.5V) and the ground voltage Vssio (0V), and are powered by the DDR3 operating voltage Vddio (1.5V) and the ground voltage Vssio (0V). The voltage difference between the two ports of the up level shifter 111 and the down level shifter 112 are higher, and exceeds 1.1V. Therefore, the up level shifter 111 and the down level shifter 112 need to adopt IO devices to be able to withstand higher voltage stress.

The voltage differences between all conducting ends of the other elements are lower, and are equal to or lower than 1.1V. Therefore, the other elements may adopt core devices having a faster speed. For example, the up buffer unit 121 is disposed between the DDR3 operating voltage Vddio (1.5V) and the first reference voltage Vbp (0.4V), with the voltage difference between these two ports not exceeding 1.1V, and so these two elements may adopt core devices. The down buffer unit 122 is similar to the up buffer unit 121. Details of the pull-up circuit 131 and the pull-down circuit 132 are to be given shortly.

Figure 4:
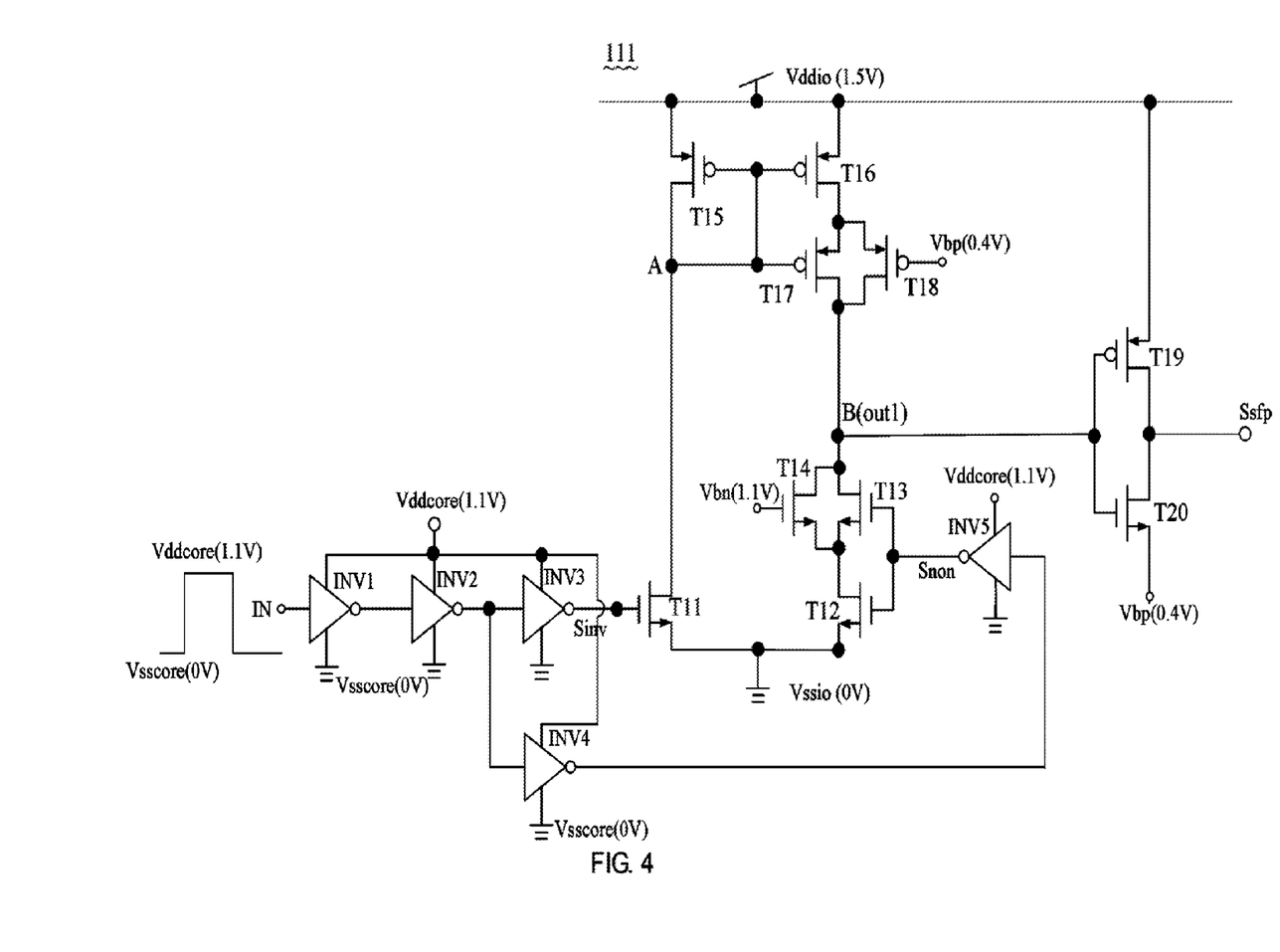
FIG. 4 is a circuit diagram of an up level shifter according to an embodiment of the present invention.

FIG. 4 shows a circuit diagram of an up level shifter according to an embodiment of the present invention. As shown in FIG. 4, the up level shifter 111 mainly includes five inverters INV1 to INV5 and ten transistors T11 to T20.

The five inverters INV1 to INV5 are disposed between the first operating voltage Vsscore (0V) and the second operating voltage Vddcore (1.1V) of the input signal IN, and are powered by the operating voltage Vsscore (0V) and the second operating voltage Vddcore (1.1V). The inverter INV1 has its input end coupled to the input signal IN, and the inverters INV1 to INV3 are connected in series to output an invert signal Sinv of the input signal IN. The inverter INV4 has its input end coupled to an output end of the inverter INV2 to connect the inverters INV1, INV2, INV4 and INV5 in series to output a non-inverted signal Snon of the input signal IN.

The switch element T11 has its control end coupled to an output end of the inverter INV3 to receive the inverted signal Sinv of the input signal, and its first path end coupled to the ground voltage Vssio.

The switch element T12 has its control end coupled to an output end of the inverter INV5 to receive the non-inverted signal Snon of the input signal IN, and its first path end coupled to the ground voltage Vssio.

The switch element T13 has its control end coupled to the control end of the switch element T12 and an output end of the inverter INV5 to receive the non-inverted signal Snon of the input signal IN, and its first path end coupled to a second path end of the switch element T12.

The switch element T14 has its control end coupled to the second reference voltage Vbn, its first path end coupled to a connecting node between the second path end of the switch element T12 and the first path end of the switch element T13, and its second path end coupled to the second path end of the switch element T13.

The switch element T15 has its first path end coupled to the DDR3 operating voltage Vddio, and its second path end and control end coupled together and further coupled to the second path end of the switch element T11. A connecting node between the second path end and the control end of the switch element T15 and the second path end of the switch element T11 is defined as a node A.

The switch element T16 has its control end coupled to the node A, and its first path end coupled to the DDR3 operating voltage Vddio.

The switch element T17 has its control end coupled to the first node A, and its first path end coupled to a second path end of the switch element T16.

The switch element T18 has its control end coupled to the first reference voltage Vbp, its first path end coupled to a connecting node between the first path end of the switch element T17 and the second path end of the switch element T17, and its second path end coupled to the second path end of the switch element T17 and further coupled to the second path end of the switch element T13 and the second path end of the switch element T14. Further, a connecting node between the second path end of the switch element T18, the second path end of the switch element T17, the second path end of the switch element T13, and the second path end of the switch element T14 is defined as a node B.

The switch element T19 and the switch element T20 both have their control ends coupled to the node B. The switch element T19 has its first path coupled to the DDR3 operating voltage Vddio, and the switch element T20 has its first path end coupled to the first reference voltage Vbp and its second path end coupled to the second path end of the switch element T19. Further, a connecting node between the second path end of the switch element T20 and the second path end of the switch element T19 serves as the output end of the up level shifter 111 to output the first shift signal Ssfp.

The switch elements T11, T12, T13, T14 and T20 are second-type switch elements, i.e., NMOS transistors; the switch elements T15, T16, T17, T18 and T19 are first-type switch elements, i.e., PMOS transistors.

The operating principle of the up level shifter is described in detail below. Referring to FIG. 3 and FIG. 4, as the input signal IN is a square-wave signal formed by the first operating voltage Vsscore (0V) and the second operating voltage Vddcore (1.1V), the high and low logic levels of the input signal IN are 1.1V and 0V, respectively. The high logic level refers to a voltage level of a signal when the signal is at logic "1", and the low logic level refers to a voltage level of a signal when the signal is at logic "0".

When the input signal IN is at logic low "0", the inverted signal Sinv of the input signal IN outputted by the inverter INV3 in FIG. 4 is at logic high "1", and so the switch element T11 is turned on; the non-inverted signal Snon of the input signal IN outputted by the inverter INV5 is at logic low "0", and so the switch elements T12 and T13 are turned off.

As the switch element T11 is turned on, the ground voltage Vssio discharges the node A through the turned on switch element T11, and the node A becomes logic low "0". The switch elements T15, T16 and T17 formed by PMOS transistors are all turned on. Further, as the control end of the switch element T18 is coupled to the first reference voltage Vbp (0.4V), i.e., at logic low "0", and so the switch element T18 is turned on. Thus, the DDR3 operating voltage Vddio charges the node A through the turned on switch element T15, and charges the node B through the turned on switch elements T16, T17 and T18, hence respectively pulling up the potential levels at the node A and the node B. At this point, for the node A, the switch element T11 is still turned on, and so the ground voltage Vssio continues discharging the node A to keep the node A at logic low "0" while keeping the switch elements T16, T17 and T18 turned on. Further, a voltage out1 at the node B is charged by the DDR3 operating voltage Vddio to pull up the voltage out1 at the node B until the voltage out1 reaches the operating voltage Vddio (1.5V) at logic high "1".

As the voltage out1 at the node B is at logic high "1", the switch element T20 is turned on and the switch element T19 is turned off. Thus, the first shift signal Ssfp outputted by the output end of the up level shifter 111 is the first reference voltage Vbp (0.4V) at logic low "0".

When the input signal IN changes from logic low "0" to logic high "1", the inverted signal Sinv of the input signal IN outputted by the inverter INV3 is at logic low "0", and so the switch element T11 is turned off, whereas the non-inverted signal Snon of the input signal IN outputted by the inverter INV5 is at logic high "1", and so the switch elements T12 and T13 are turned on. Further, the control end of the switch element T14 is coupled to the second reference voltage Vbn (1.1V) and is at logic high "1", and so the switch element T14 is turned on.

At this point, the node A is still at logic low "0", and the switch elements T15, T16 and T17 are kept turned on. However, as the switch element T11 is turned off, i.e., the ground voltage Vssio stops discharging the node A, the voltage at the node A gradually rises due to the turned on switch element T15 until it reaches a threshold voltage, i.e., at logic high "1", such that the switch elements T15, T16 and T17 become turned off. Because the switch elements T16 and T17 are turned off, the DDR3 operating voltage Vddio stops charging the node B.

At this point, the switch elements T12, T13 and T14 are turned on, and the voltage out1 at the node B becomes discharged by the ground voltage Vssio to pull down the voltage out1 at the node B until the voltage out1 reaches the ground voltage Vssio (0V) and becomes logic low "0". As the voltage out1 at the node B is at logic low "0", the switch element T20 is turned off and the switch element T19 is turned on. Thus, the first shift signal Ssfp outputted by the output end of the up level shifter 111 becomes the DDR3 operating voltage Vddio (1.5V) and is at logic high "1".

When the input signal IN is kept stable at logic high "1", the switch elements T11, T15, T16 and T17 are kept turned off, the switch elements T12, T13 and T14 are turned on, and the node B is discharged by the ground voltage Vssio to be in logic low "0". Further, the switch element T19 is turned on, the switch element T20 is turned off, the DDR3 operating voltage Vddio charges the output end of the up level shifter, and the first shift signal Ssfp outputs the operating voltage Vddio (1.5V).

When the input signal IN changes from logic high "1" to logic low "0", the inverted signal Sinv of the input signal IN outputted by the inverter INV3 is at logic high "1", and so the switch element T11 is turned on; whereas the non-inverted signal Snon of the input signal IN outputted from the inverter INV5 is at logic low "0", and so the switch elements T12 and T13 are turned off.

As the switch element T11 is turned on, the ground voltage Vssio discharges the node A, and the node A becomes logic low "0". The switch elements T15, T16 and T17 are turned on, and so the DDR3 operating voltage Vddio (1.5V) charges the node B through the turned on switch elements T16, T17 and T18.

With to the presence of the switch element T18, when the switch elements T16 and T17 are turned on, the switch elements T16 and T17 form a charging path, and the switch elements T16 and T18 form another charging path. Thus, the DDR3 operating voltage Vddio may charge the voltage out1 at the node B through these two charging paths. That is to say, the presence of the switch element T18 protects and prevents the switch element T17 from larger voltage stress. Similarly, with the presence of the switch element T14, when the switch elements T12 and T13 are turned on, the ground voltage Vssio may discharge the voltage out1 at the node B through two discharging paths. That is, the presence of the switch element T14 protects and prevents the switch element T13 from large voltage stress.

It should be noted that, the voltage out1 at the node B changes between the ground voltage Vssio (0V) and the DDR3 operating voltage Vddio (1.5V), and the first path end of the switch element T19 is coupled to the DDR3 operating voltage Vddio (1.5V). Thus, the switch element T19 needs to adopt an IO device to withstand larger voltage stress. The first path end of the switch element T20 is coupled to the first reference voltage Vbp (0.4V), and so the switch element T20 may adopt a core device. One person skilled in the art can understand that, the other components of the up level shifter 111 may be core devices. For example, the inverters INV1 to INV5 are disposed between the first operating voltage Vsscore (0V) and the second operating voltage (1.1V), and so may be implemented by core device. Since the switch elements T11 and T15 are connected in series and disposed between the DDR3 operating voltage Vddio (1.5V) and the ground voltage Vssio (0V), and also with the presence of the threshold voltage, the switch elements T11 and T15 may also adopt core devices. Similarly, the switch elements T12, T13, T14, T16, T17 and T18 may also adopt core devices. That is to say, in the up level shifter 111, apart from the switch element T19 that needs to adopt an IO device, all the other components may adopt core devices, so as to provide a stronger driving capability and to reduce the semiconductor area.

Figure 5:
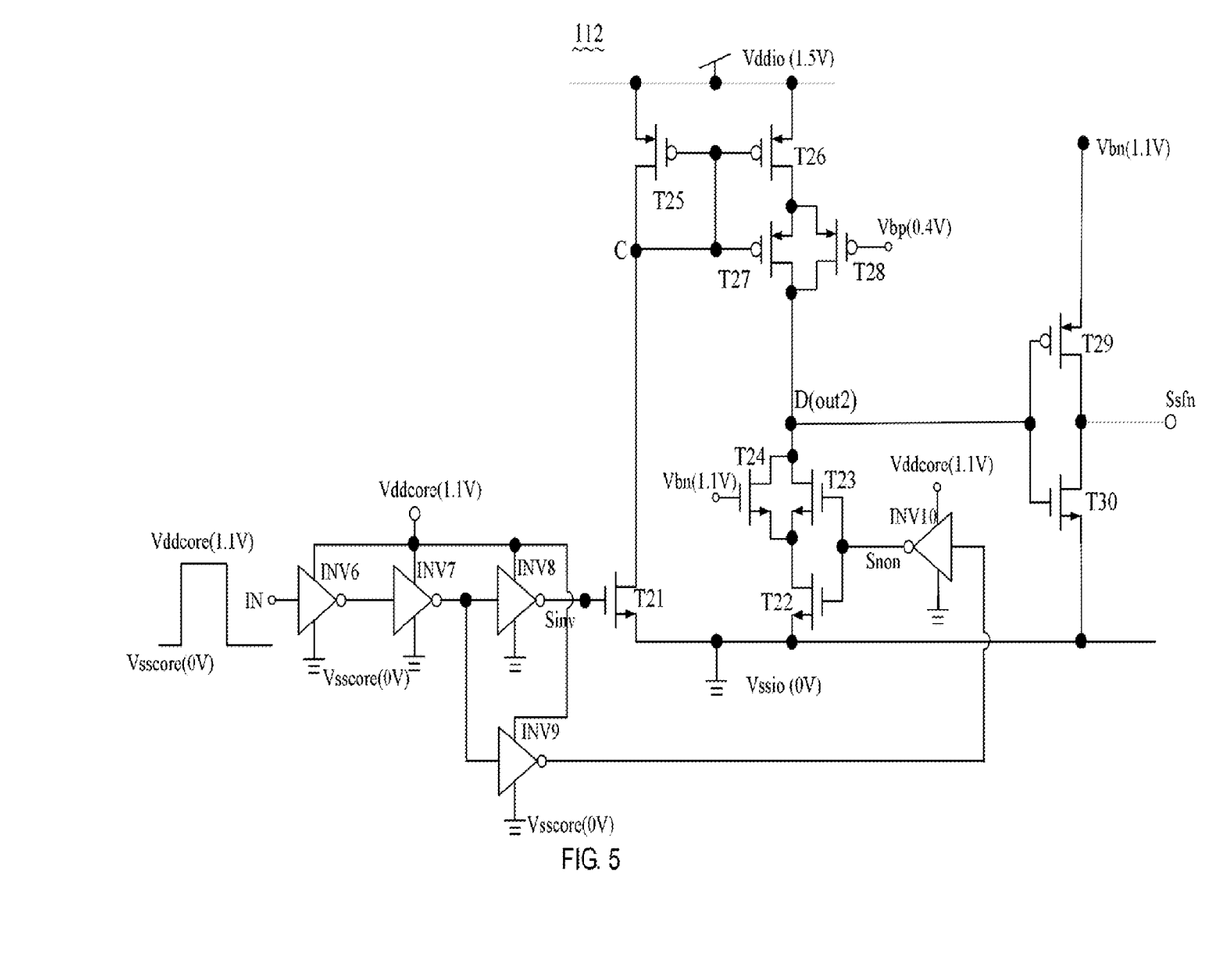
FIG. 5 is a circuit diagram of a down level shifter according to an embodiment of the present invention.

FIG. 5 shows a circuit diagram of a down level shifter according to an embodiment of the present invention. As shown in FIG. 5, the down level shifter 112 also mainly includes five inverters INV6 to INV10 and ten transistors T21 to T30.

The five inverters INV6 to INV10 are disposed between the first operating voltage Vsscore (0V) and the second operating voltage Vddcore (1.1V) of the input signal IN, and are powered by the first operating voltage Vsscore and the second operating voltage Vddcore. The inverter INV6 has its input end coupled to the input signal IN. The inverters INV6 to INV8 are connected in series to output the inverted signal Sinv of the input signal IN. The inverter INV9 has its input end coupled to an output end of the inverter INV7 to connect the inverters INV6, INV7, INV9 and INV10 in series and to further output the non-inverted signal Snon of the input signal IN.

The switch element T21 has its control end coupled to an output end of the inverter INV8 to receive the inverted signal Sinv of the input signal IN, and its first path end coupled to the ground voltage Vssio.

The switch elements T22 and T23 have their control ends coupled to an output end of the inverter INV10 to receive the non-inverted signal Snon of the input signal IN. The switch element T22 has its first path end coupled to the ground voltage Vssio, and the switch element T23 has its first path end coupled to a second path end of the switch element T22.

The switch element T24 has its control end coupled to the second reference voltage Vbn, its first path end coupled to a connecting node between the second path end of the switch element T22 and the first path end of the switch element T23, and its second path end coupled to the second path end of the switch element T23.

The switch element T25 has its first path end coupled to the DDR3 operating voltage Vddio, and its second path end and control end coupled together and further coupled to the second path end of the switch element T21. A connecting node between the second path end and the control end of the switch element T25 and the second path end of the switch element T21 is defined as a node C.

The switch element T26 and the switch element T27 have their control ends coupled to the node C. The switch element T26 has its first path end coupled to the DDR3 operating voltage, and the switch element T27 has its first path end coupled to a second path end of the switch element T26.

The switch element T28 has its control end coupled to the first reference voltage Vbp, its first path end coupled to a connecting node between the first path end of the switch element T27 and the second path end of the switch element T26, and its second path end coupled to the second path end of the switch element T27 and further coupled to the second path end of the switch element T23 and the second path end of the switch element T24. A connecting node between the second path end of the switch element T28, the second path end of the switch element T27, the second end of the switch element T23 and the second path end of the switch element T24 is defined as a node D.

The switch element T29 and the switch element T30 have their control ends coupled to the node D. The switch element T29 has its first path end coupled to the second reference voltage Vbn. The switch element T30 has its first path end coupled to the ground voltage Vssio, and its second path end coupled to a second path end of the switch element T29. A connecting node between the second path end of the switch element T30 and the second path end of the switch element T29 serves as the output end of the down level shifter 112 to output the second shift signal.

The switch elements T21, T22, T23, T24 and T30 are second-type switch elements, i.e., PMOS transistors; the switch elements T25, T26, T27, T28 and T29 are first-type switch elements, i.e., NMOS transistors.

One person skilled in the art can understand that, operating principles of the down level shifter 112 in FIG. 5 are similar to those of the up level shifter 111 in FIG. 4, with difference being that the first path end of the switch element T29 is coupled to the second reference voltage Vbn and the first path end of the switch element T30 is coupled to the ground voltage Vssio. Thus, the second shift signal Ssfn outputted by the down level shifter 112 switches between the ground voltage Vssio (0V) and the second reference voltage Vbn (1.1V). In the down level shifter 112, the switch element T29 may adopt a core device, and the switch element T30 needs to adopt an IO device to withstand greater voltage stress. Similar to the up level shifter 111, the other components in the down level shifter 112 may adopt core devices, so as to have a stronger driving capability and a smaller semiconductor area.

In the present invention, by designing different component sizes for the up level shifter 111 and the down level shifter 112, a non-overlapping area between the first shift signal Ssfp outputted by the up level shifter 111 and the second shift signal Ssfn outputted by the down level shifter 112 can be realized.

Figure 6:
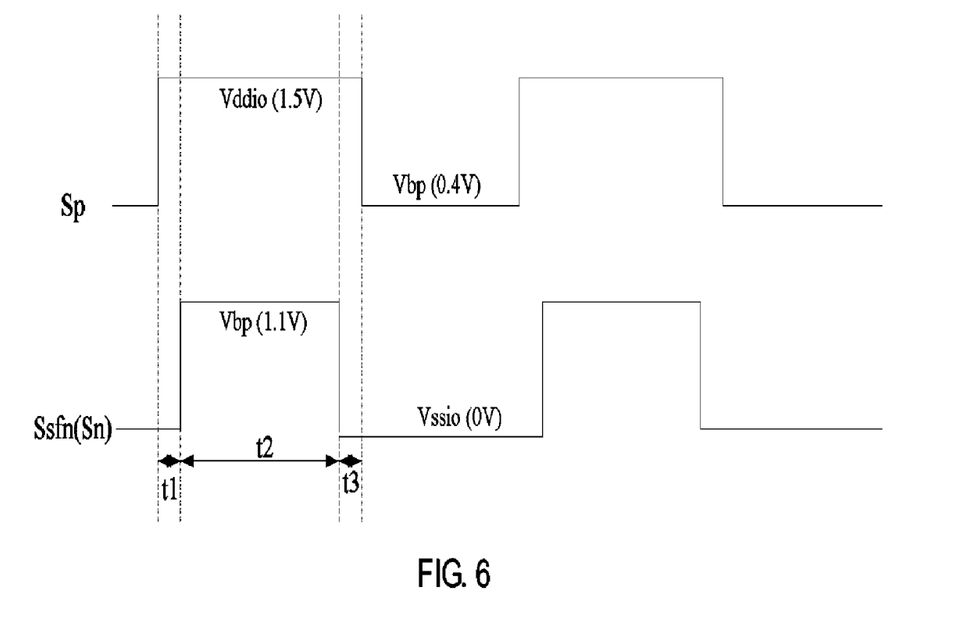
FIG. 6 is a timing diagram of a first logic signal and a second logic signal in FIG. 3.

Again referring to FIG. 3, the first logic signal Sp and the second signal Sn are obtained after a capacitive load process is performed on the first shift signal Ssfp and the second shift signal Ssfn by the up buffer unit 121 and the down buffer unit 122, respectively. The first logic signal Sp, similar to the first shift signal Ssfp, switches between the first reference voltage Vbp (0.4V) and the DDR3 operating voltage Vddio (1.5V). The second logic signal Sn, similar to the second shift signal Ssfn, switches between the ground voltage Vssio (0V) and the second reference voltage Vbn (1.1V). FIG. 6 shows a timing diagram of the first logic signal Sp and the second logic signal Sn. As shown in FIG. 6, the first logic signal Sp and the second logic signal Sn are similar to the first shift signal Ssfp and the second shift signal Ssfn, and also have a non-overlapping area, e.g., periods t1 and t3.

Referring to FIG. 3 and FIG. 6, before the period t1, the first logic signal Sp and the second logic signal Sn are both at logic low "0" (as shown by the first shift signal Ssfp and the second shift signal Ssfn), the switch elements T1 to T3 in the pull-up circuit 131 are turned on, the pull-up circuit 131 operates, the DDR3 operating voltage Vddio charges the connecting pad 101, and the pull-down circuit 132 does not operate. Further, in the charging process, the switch elements T1 and T2 form a charging path, and the switch elements T1 and T3 form another charging path, thereby providing a stronger driving capability.

In the periods t1 to t3, i.e., in the non-overlapping area (as shown by the first shift signal Ssfp and the second shift signal Ssfn) of the first logic signal Sp and the second logic signal Sn, the pull-up circuit 131 and the pull-down circuit 132 do not operate.

In the period t2, the first logic signal Sp and the second logic signal Sn are both at logic high "1" (as shown by the first shift signal Ssfp and the second shift signal Ssfn), the switch elements T4 to T6 in the pull-down circuit 132 are turned on, the pull-down circuit 132 operates, the ground voltage Vssio discharges the connecting pad 101, and the pull-up circuit 131 does not operate. Similarly, in the discharging process, the switch elements T4 and T5 form a charging path, and the switch elements T4 and T6 form another charging path, thereby providing a stronger driving capability.

It should be noted that, as the first logic signal Sp is a square-wave signal formed by the first reference voltage Vbp (0.4V) and the DDR3 operating voltage Vddio (1.5V), the voltage differences between the conducting ends of the components in the pull-up circuit 131 do not exceed 1.1V, and so the components may adopt core devices. Similarly, as the second logic signal Sn is a square-wave signal formed by the ground voltage Vssio (0V) and the second reference voltage Vbn (1.1V), the components in the pull-down circuit 132 may adopt core devices.

In conclusion, in the signal transmission circuit 100 suitable for DDR of the present invention, only the up level shifter 111 and the down level shifter 112 adopt IO devices to correspondingly output the first shift signal Ssfp and the second shift signal Ssfn, and other device may adopt core devices. Therefore, the signal transmission circuit 100 suitable for DDR of the present invention has a stronger driving capability and occupies a smaller semiconductor area. Further, the up level shifter 111 and the down level shifter 112 may utilize the first reference voltage Vbn and the second reference voltage Vbp to stably output the first shift signal Ssfp and the second shift signal Ssfn, and thus have a higher stability.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A signal transmission circuit suitable for DDR, adapted to drive a connecting pad, said signal transmission circuit comprising:
    a level shifting circuit, comprising:
        an up level shifter;
        a down level shifter; and
        wherein, the up level shift and the down level shifter are disposed between a DDR operating voltage and a ground voltage, receive an input signal, and correspondingly output a first shift signal and a second shift signal, respectively; the input signal comprises a first operating voltage and a second operating voltage, the first operating voltage is equal to the ground voltage, and the second operating voltage is smaller than the DDR operating voltage;
    a buffer circuit, comprising:
        an up buffer unit, disposed between the DDR operating voltage and a first reference voltage, coupled to an output of the up level shifter to receive the first shift signal and to output a first logic signal according to the first shift signal; and
        a down buffer unit, disposed between the ground voltage and a second reference voltage, coupled to an output of the down level shifter to receive the second shift signal and to output a second logic signal according to the second shift signal;
    an output circuit, comprising:
        a pull-up circuit, coupled between the DDR operating voltage and the connecting pad, further coupled to the up buffer unit to selectively output the DDR operating voltage to the connecting pad according to the first logic signal; and
        a pull-down circuit, coupled between the ground voltage and the connecting pad, further coupled to the down buffer unit to selectively output the ground voltage to the connecting pad according to the second logic signal;
    wherein, the up level shifter and the down level shifter adopt input and output (IO) devices to respectively output the first shift signal and the second shift signal; the up buffer unit, the down buffer unit, the pull-up circuit and the pull-down circuit adopt core devices; the second reference voltage is equal to the second operating voltage, and the first reference voltage is a difference between the DDR operating voltage and the second reference voltage, wherein the up level shifter comprises:

a $1^{st}$ inverter;

a $2^{nd}$ inverter;

a $3^{rd}$ inverter;

a $4^{th}$ inverter; and a $5^{th}$ inverter;

wherein, the $1^{st}$ to $5^{th}$ inverters are disposed between the first operating voltage and the second operating voltage of the input signal, the $1^{st}$ inverter has its input end coupled to the input signal, the $1^{st}$, $2^{nd}$ and $3^{rd}$ inverters are connected in series to output an inverted signal of the input signal, the $4^{th}$ inverter has its input end coupled to an output end of the $2^{nd}$ inverter to cause the $1^{st}$, $2^{nd}$, $4^{th}$ and $5^{th}$ inverters to be connected in series to output a non-inverted signal of the input signal;

an $11^{th}$ switch element, comprising a control end, a first path end and a second path end, the $11^{th}$ switch element having its control end coupled to an output end of the $3^{rd}$ inverter to receive the inverted signal of the input signal, and its first path end coupled to the ground voltage;

a $12^{th}$ switch element, comprising a control end, a first path end and a second path end, the $12^{th}$ switch element having its control end coupled to an output end of the $5^{th}$ inverter to receive the non-inverted signal of the input signal, and its first path end coupled to the ground voltage;

a $13^{th}$ switch element, comprising a control end, a first path end and a second path end, the $13^{th}$ switch element having its control end coupled the control end of the $12^{th}$ switch element and the output end of the $5^{th}$ inverter to receive the non-inverted signal of the input signal, and its first path end coupled to the second path end of the $12^{th}$ switch element;

a $14^{th}$ switch element, comprising a control end, a first path end and a second path end, the $14^{th}$ switch element having its control end coupled to the second reference voltage, its first path end coupled to a connecting node between the second path end of the $12^{th}$ switch element and the first path end of the $13^{th}$ switch element, and its second path end coupled to the second path end of the $13^{th}$ switch element;

a $15^{th}$ switch element, comprising a control end, a first path end and a second path end, the $15^{th}$ switch element having its first path end coupled to the DDR operating voltage, its second path end and control end coupled together and further coupled to the second path end of the $11^{th}$ switch element, wherein a connecting node between the second path end of the $15^{th}$ switch element and the second path end of the $11^{th}$ switch element is defined as a first node;

a $16^{th}$ switch element, comprising a control end, a first path end and a second path end, the $16^{th}$ switch element having its control end coupled to the first node, its first path end coupled to the DDR operating voltage;

a $17^{th}$ switch element, comprising a control end, a first path end and a second path end, the $17^{th}$ switch element having its control end coupled to the first node, and its path end coupled to the second path end of the $16^{th}$ switch element;

an $18^{th}$ switch element, comprising a control end, a first path end and a second path end, the $18^{th}$ switch element having its control end coupled to the first reference voltage, its first path end coupled to a connecting node between the first path end of the $17^{th}$ switch element and the second path end of the $16^{th}$ switch element, its second path end coupled to the second path end of the $17^{th}$ switch element and further coupled to the second path end of the $13^{th}$ switch element and the second path end of the $14^{th}$ switch element, wherein a connecting node between the second path end of the $18^{th}$ switch element, the second path end of the $17^{th}$ switch element, the second path end of the $13^{th}$ switch element and the second path end of the $14^{th}$ switch element is defined as a second node;

a $19^{th}$ switch element, comprising a control end, a first path end and a second path end, the $19^{th}$ switch element having its control end coupled to the second node, and its first path end coupled to the DDR operating voltage; and a $20^{th}$ switch element, comprising a control end, a first path end and a second path end, the $20^{th}$ switch element having its control end coupled to the second node, its first path end coupled to the first reference voltage, and its second path end coupled to the second path end of the $19^{th}$ switch element, wherein a connecting node between the second path end of the $20^{th}$ switch element and the second path end of the $19^{th}$ switch element serves as the output end of the up level shifter to output the first shift signal;

wherein, the $11^{th}$, $12^{th}$, $13^{th}$, $14^{th}$ and $20^{th}$ switch elements are second-type switch elements, the $15^{th}$, $16^{th}$, $17^{th}$, $18^{th}$ and $19^{th}$ switch elements are first-type switch elements, and a type of the first-type switch elements is opposite a type of the second-type switch elements.

2. The signal transmission circuit according to claim 1, wherein:

the up level shifter comprises one of the IO devices, coupled to the DDR operating voltage, for outputting the first shift signal; and the down level shifter comprises another of the IO devices, coupled to the ground voltage, for outputting the second shift signal, so that the up level shifter and the down level shifter withstand most voltage stress of the signal transmission circuit.

3. The signal transmission circuit according to claim 1, wherein:

during a charging process of the signal transmission circuit, each of the pull-up circuit and the pull-down circuit comprises two charging paths.

4. The signal transmission circuit according to claim 1, wherein:

the pull-up circuit comprises:

a $1^{st}$ switch element, comprising a control end, a first path end and a second path end, the $1^{st}$ switch element having its control end coupled to an output end of the up buffer unit via a first resistor to receive the first logic signal, and its first path end coupled to the DDR operating voltage;

a $2^{nd}$ switch element, comprising a control end, a first path end and a second path end, the $2^{nd}$ switch element having its control end coupled to the output end of the up buffer unit to receive the first logic signal, its first path end coupled to a second path end of the $1^{st}$ switch element, and its second path end coupled to the connecting pad via a second resistor;

a $3^{rd}$ switch element, comprising a control end, a first path end and a second path end, the $3^{rd}$ switch element having its control end coupled to the first reference voltage, its first path end coupled to a connecting node between the second path end of the 1st switch element and the first path end of the 2nd switch element, and its second path end coupled to a connecting node between the second path end of the 2nd switch element and the second resistor;

the pull-down circuit comprises:

a 4th switch element, comprising a control end, a first path end and a second path end, the 4th switch element having its control end coupled to an output end of the down buffer unit via a third resistor to receive the second logic signal, and its first path end coupled to the ground voltage;

a 5th switch element, comprising a control end, a first path end and a second path end, the 5th switch element having its control end coupled to the output end of the down buffer unit to receive the second logic signal, its first path end coupled to a second path end of the 4th switch element, and its second path end coupled to the connecting pad via a fourth resistor;

a 6th switch element, comprising a control end, a first path end and a second path end, the 6th switch element having its control end coupled to the second reference voltage, its first path end coupled to a connecting node between the second path end of the 4th switch element and the first path end of the 5th switch element, and its second path end coupled to a connecting node between the second path end of the 5th switch element and the fourth resistor;

wherein, the 1st, 2nd and 3rd switch elements are first-type switch elements, the 4th, 5th and 6th switch elements are second-type switch elements, and a type of the first-type switch elements is opposite a type of the second-type switch elements.

5. The signal transmission circuit according to claim 4, wherein:

the pull-up circuit further comprises:

a 7th switch element, comprising a control end, a first path end and a second path end, the 7th switch element having its control end coupled to the control end of the 3rd switch element and the first reference voltage, and its first path end and second path end coupled to the DDR operating voltage; and a 1st diode, having its anode coupled to a connecting node between the second resistor and the fourth resistor and the connecting pad, and its cathode coupled to the DDR operating voltage; and the pull-down circuit further comprises:

an 8th switch element, comprising a control end, a first path end and a second path end, the 8th switch element having its control end coupled to the control end of the 6th switch element and the second reference voltage, and its first path end and second path end coupled to the ground voltage; and a 2nd diode, having its anode coupled to the ground voltage, and its cathode coupled to the connecting node between the second resistor and the fourth resistor and the connecting pad;

wherein, the 7th switch element is the first-type switch element, and the 8th switch element is the second-type switch element.

6. The signal transmission circuit according to claim 5, wherein the 1st, 2nd, 3rd and 7th switch elements are PMOS transistors, and the 4th, 5th, 6th and 8th switch elements are NMOS transistors.

7. The signal transmission circuit according to claim 1, wherein the 11th, 12th, 13th, 14th and 20th switch elements are NMOS transistors, and the 15th, 16th, 17th, 18th and 19th switch elements are PMOS transistors.

8. The signal transmission circuit according to claim 1, wherein the 19th switch element is one of the IO devices and the 20th switch element is one of the core devices.

9. The signal transmission circuit according to claim 1, wherein the down level shifter comprises:

a 6th inverter;

a 7th inverter;

an 8th inverter;

a 9th inverter; and a 10th inverter;

wherein, the 6th to 10th inverters are disposed between the first operating voltage and the second operating voltage of the input signal, the 6th inverter has its input end coupled to the input signal, the 6th, 7th and 8th inverters are connected in series to output the inverted signal of the input signal, the 9th inverter has its input end coupled to an output end of the 7th inverter to cause the 6th, 7th, 9th and 10th inverters to be connected in series to output the non-inverted signal of the input signal;

a 21st switch element, comprising a control end, a first path end and a second path end, the 21st switch element having its control end coupled to an output end of the 8th inverter to receive the inverted signal of the input signal, and its first path end coupled to the ground voltage;

a 22nd switch element, comprising a control end, a first path end and a second path end, the 22nd switch element having its control end coupled to an output end of the 10th inverter to receive the non-inverted signal of the input signal, and its first path end coupled to the ground voltage;

a 23rd switch element, comprising a control end, a first path end and a second path end, the 23rd switch element having its control end coupled to the control end of the 22nd switch element and the output end of the 10th inverter to receive the non-inverted signal of the input signal, and its first path end coupled to the second path end of the 22nd switch element;

a 24th switch element, comprising a control end, a first path end and a second path end, the 24th switch element having its control end coupled to the second reference voltage, its first path end coupled to a connecting node between the second path end of the 22nd switch element and the first path end of the 23rd switch element, and its second path end coupled to the second path end of the 23rd switch element;

a 25th switch element, comprising a control end, a first path end and a second path end, the 25th switch element having its first path end coupled to the DDR operating voltage, and its second path end and control end coupled together and further coupled to the second path end of the 21st switch element, wherein a connecting node between the second path end and control end of the 25th switch element and the second path end of the 21st switch element is defined as a third node;

a 26th switch element, comprising a control end, a first path end and a second path end, the 26th switch element having its control end coupled to the third node, and its first path end coupled to the DDR operating voltage;

a 27th switch element, comprising a control end, a first path end and a second path end, the 27th switch element having its control end coupled to the third node, and its first path end coupled to the second path end of the 26th switch element;

a 28$^{th}$ switch element, comprising a control end, a first path end and a second path end, the 28$^{th}$ switch element having its control end coupled to the first reference voltage, its first path end coupled to a connecting node between the first path end of the 27$^{th}$ switch element and the second path end of the 26$^{th}$ switch element, and its second path end coupled to the second path end of the 27$^{th}$ switch element and further coupled to the second path end of the 23$^{rd}$ switch element and the second path end of the 24$^{th}$ switch element, wherein a connecting point between the second path end of the 28$^{th}$ switch element, the second path end of the 27$^{th}$ switch element, the second path end of the 23$^{rd}$ switch element and the second path end of the 24$^{th}$ switch element is defined as a fourth node;

a 29$^{th}$ switch element, comprising a control end, a first path end and a second path end, the 29$^{th}$ switch element having its control end coupled to the fourth node, and its first path end coupled to the second reference voltage; and a 30$^{th}$ switch element, comprising a control end, a first path end and a second path end, the 30$^{th}$ switch element having its control end coupled to the fourth node, its first path end coupled to the ground voltage, and its second path end coupled to the second path end of the 29$^{th}$ switch element, wherein a connecting node of the second path end of the 30$^{th}$ switch element and the second path end of the 29$^{th}$ switch element serves as the output end of the down level shifter to output the second shift signal;

wherein, the 21$^{st}$, 22$^{nd}$, 23$^{rd}$, 24$^{th}$ and 30$^{th}$ switch elements are second-type switch elements, the 25$^{th}$, 26$^{th}$, 27$^{th}$, 28$^{th}$ and 29$^{th}$ switch elements are first-type switch elements, and a type of the first-type switch elements is opposite a type of the second-type switch elements.

10. The signal transmission circuit according to claim 9, wherein the 21$^{st}$, 22$^{nd}$, 23$^{rd}$, 24$^{th}$ and 30$^{th}$ switch elements are NMOS transistors, and the 25$^{th}$, 26$^{th}$, 27$^{th}$, 28$^{th}$ and 29$^{th}$ switch elements are PMOS transistors.

11. The signal transmission circuit according to claim 9, wherein the 30$^{th}$ switch element is an IO device and the 29$^{th}$ switch element is a core device.

12. A signal transmission circuit suitable for DDR, adapted to drive a connecting pad, said signal transmission circuit comprising:
 a level shifting circuit, comprising:
  an up level shifter;
  a down level shifter; and
  wherein, the up level shift and the down level shifter are disposed between a DDR operating voltage and a ground voltage, receive an input signal, and correspondingly output a first shift signal and a second shift signal, respectively; the input signal comprises a first operating voltage and a second operating voltage, the first operating voltage is equal to the ground voltage, and the second operating voltage is smaller than the DDR operating voltage;
 a buffer circuit, comprising:
  an up buffer unit, disposed between the DDR operating voltage and a first reference voltage, coupled to an output of the up level shifter to receive the first shift signal and to output a first logic signal according to the first shift signal; and
  a down buffer unit, disposed between the ground voltage and a second reference voltage, coupled to an output of the down level shifter to receive the second shift signal and to output a second logic signal according to the second shift signal;
 an output circuit, comprising:
  a pull-up circuit, coupled between the DDR operating voltage and the connecting pad, further coupled to the up buffer unit to selectively output the DDR operating voltage to the connecting pad according to the first logic signal; and
  a pull-down circuit, coupled between the ground voltage and the connecting pad, further coupled to the down buffer unit to selectively output the ground voltage to the connecting pad according to the second logic signal;
 wherein, the up level shifter and the down level shifter adopt input and output (IO) devices to respectively output the first shift signal and the second shift signal; the up buffer unit, the down buffer unit, the pull-up circuit and the pull-down circuit adopt core devices; the second reference voltage is equal to the second operating voltage, and the first reference voltage is a difference between the DDR operating voltage and the second reference voltage,
 wherein the down level shifter comprises:
  a 6$^{th}$ inverter;
  a 7$^{th}$ inverter;
  an 8$^{th}$ inverter;
  a 9$^{th}$ inverter; and
  a 10$^{th}$ inverter;
  wherein, the 6$^{th}$ to 10$^{th}$ inverters are disposed between the first operating voltage and the second operating voltage of the input signal, the 6$^{th}$ inverter has its input end coupled to the input signal, the 6$^{th}$, 7$^{th}$ and 8$^{th}$ inverters are connected in series to output the inverted signal of the input signal, the 9$^{th}$ inverter has its input end coupled to an output end of the 7$^{th}$ inverter to cause the 6$^{th}$, 7$^{th}$, 9$^{th}$ and 10$^{th}$ inverters to be connected in series to output the non-inverted signal of the input signal;
  a 21$^{st}$ switch element, comprising a control end, a first path end and a second path end, the 21$^{st}$ switch element having its control end coupled to an output end of the 8$^{th}$ inverter to receive the inverted signal of the input signal, and its first path end coupled to the ground voltage;
  a 22$^{nd}$ switch element, comprising a control end, a first path end and a second path end, the 22$^{nd}$ switch element having its control end coupled to an output end of the 10$^{th}$ inverter to receive the non-inverted signal of the input signal, and its first path end coupled to the ground voltage;
  a 23$^{rd}$ switch element, comprising a control end, a first path end and a second path end, the 23$^{rd}$ switch element having its control end coupled to the control end of the 22$^{nd}$ switch element and the output end of the 10$^{th}$ inverter to receive the non-inverted signal of the input signal, and its first path end coupled to the second path end of the 22$^{nd}$ switch element;
  a 24$^{th}$ switch element, comprising a control end, a first path end and a second path end, the 24$^{th}$ switch element having its control end coupled to the second reference voltage, its first path end coupled to a connecting node between the second path end of the 22$^{nd}$ switch element and the first path end of the 23$^{rd}$ switch element, and its second path end coupled to the second path end of the 23$^{rd}$ switch element;
  a 25$^{th}$ switch element, comprising a control end, a first path end and a second path end, the 25$^{th}$ switch element having its first path end coupled to the DDR operating voltage, and its second path end and control end coupled together and further coupled to the second path end of the 21$^{st}$ switch element, wherein a connecting node between the second path end and control end of the 25$^{th}$ switch element and the second path end of the 21$^{st}$ switch element is defined as a third node;

a 26$^{th}$ switch element, comprising a control end, a first path end and a second path end, the 26$^{th}$ switch element having its control end coupled to the third node, and its first path end coupled to the DDR operating voltage;

a 27$^{th}$ switch element, comprising a control end, a first path end and a second path end, the 27$^{th}$ switch element having its control end coupled to the third node, and its first path end coupled to the second path end of the 26$^{th}$ switch element;

a 28$^{th}$ switch element, comprising a control end, a first path end and a second path end, the 28$^{th}$ switch element having its control end coupled to the first reference voltage, its first path end coupled to a connecting node between the first path end of the 27$^{th}$ switch element and the second path end of the 26$^{th}$ switch element, and its second path end coupled to the second path end of the 27$^{th}$ switch element and further coupled to the second path end of the 23$^{rd}$ switch element and the second path end of the 24$^{th}$ switch element, wherein a connecting point between the second path end of the 28$^{th}$ switch element, the second path end of the 27$^{th}$ switch element, the second path end of the 23$^{rd}$ switch element and the second path end of the 24$^{th}$ switch element is defined as a fourth node;

a 29$^{th}$ switch element, comprising a control end, a first path end and a second path end, the 29$^{th}$ switch element having its control end coupled to the fourth node, and its first path end coupled to the second reference voltage; and a 30$^{th}$ switch element, comprising a control end, a first path end and a second path end, the 30$^{th}$ switch element having its control end coupled to the fourth node, its first path end coupled to the ground voltage, and its second path end coupled to the second path end of the 29$^{th}$ switch element, wherein a connecting node of the second path end of the 30$^{th}$ switch element and the second path end of the 29$^{th}$ switch element serves as the output end of the down level shifter to output the second shift signal;

wherein, the 21$^{st}$, 22$^{nd}$, 23$^{rd}$, 24$^{th}$ and 30$^{th}$ switch elements are second-type switch elements, the 25$^{th}$, 26$^{th}$, 27$^{th}$, 28$^{th}$ and 29$^{th}$ switch elements are first-type switch elements, and a type of the first-type switch elements is opposite a type of the second-type switch elements.

* * * * *